United States Patent
Jones, Jr. et al.

(10) Patent No.: US 6,732,305 B2
(45) Date of Patent: May 4, 2004

(54) TEST INTERFACE FOR VERIFICATION OF HIGH SPEED EMBEDDED SYNCHRONOUS DYNAMIC RANDOM ACCESS MEMORY (SDRAM) CIRCUITRY

(75) Inventors: Oscar Frederick Jones, Jr., Colorado Springs, CO (US); Michael C. Parris, Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 497 days.

(21) Appl. No.: 09/848,800

(22) Filed: May 4, 2001

(65) Prior Publication Data

US 2002/0042898 A1 Apr. 11, 2002

Related U.S. Application Data

(60) Provisional application No. 60/238,228, filed on Oct. 5, 2000.

(51) Int. Cl.$^7$ .................. G11C 29/00; G01R 31/28; G06F 11/25; G06F 11/27
(52) U.S. Cl. .................. 714/718; 714/731; 714/744; 365/201
(58) Field of Search .................. 365/192, 201; 714/718, 744, 719–723

(56) References Cited

U.S. PATENT DOCUMENTS 6,292,873 B1 * 9/2001 Keaveny et al. ............ 711/149
6,324,118 B1 * 11/2001 Ooishi ........................ 365/233
6,625,766 B1 * 9/2003 Oh et al. ..................... 714/719

* cited by examiner

*Primary Examiner*—R. Stephen Dildine
(74) *Attorney, Agent, or Firm*—William J. Kubida; Peter J. Meza; Hogan & Hartson LLP

(57) ABSTRACT

An integrated and constantly enabled on-chip test interface for use in verifying the functionality of high speed embedded memories such as synchronous dynamic random access memories ("SDRAM") which allows for the utilization of existing, relatively low speed, (and hence low cost), testers to perform the testing. The interface allows for the verification of an embedded memory macro design utilizing a test interface which includes the memory macro and separate on-chip test circuitry so that half-rate, narrow word, input signals from a tester can perform all memory macro operations across the breadth of a wide memory macro input/output ("I/O") architecture. The on-chip test circuitry may also include a synchronizing circuit to minimize skew between the external clock and the data output from the test chip.

23 Claims, 13 Drawing Sheets

| Fig. 5A | Fig. 5B |

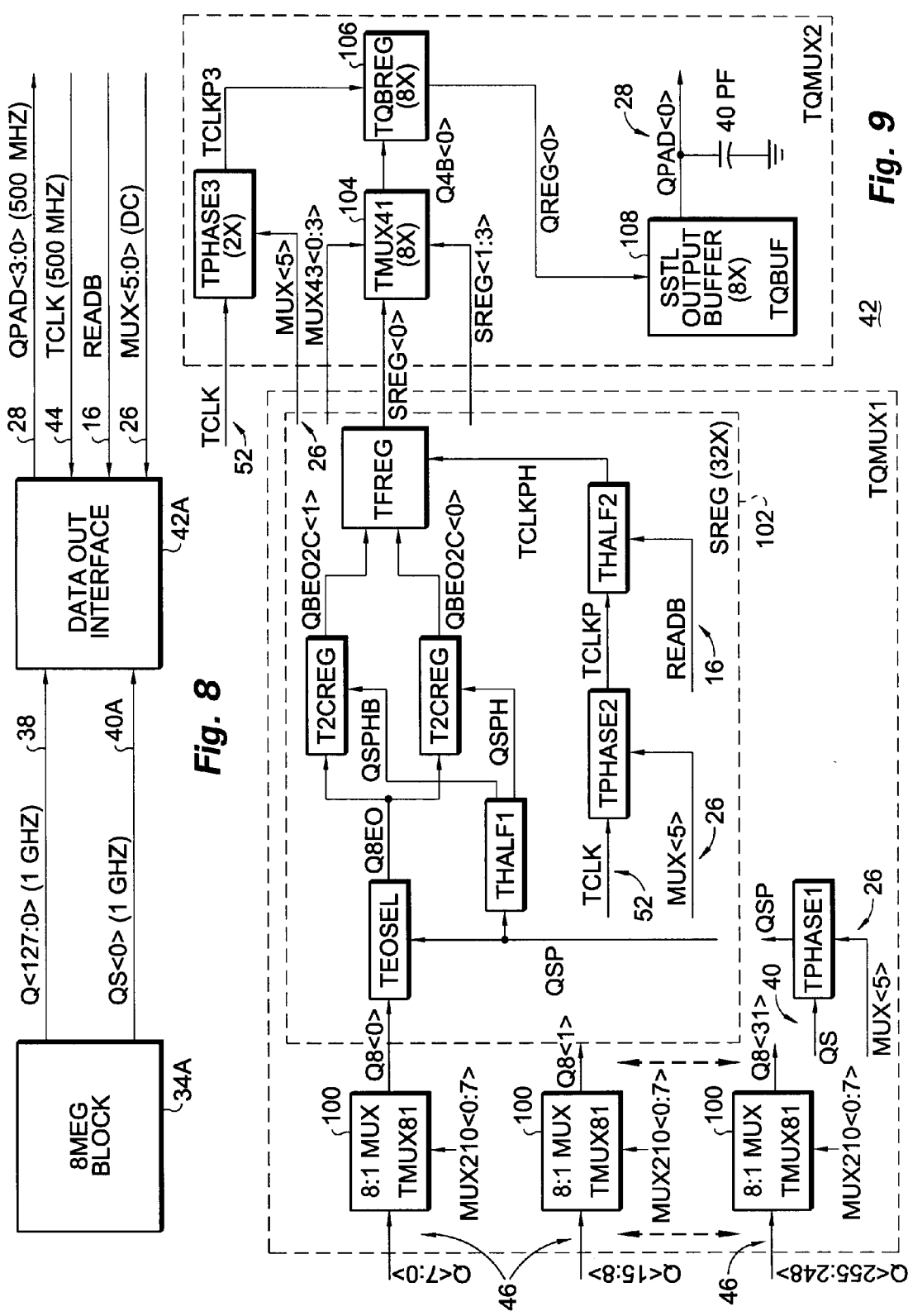

TEST INTERFACE FOR VERIFICATION OF HIGH SPEED EMBEDDED SYNCHRONOUS DYNAMIC RANDOM ACCESS MEMORY (SDRAM) CIRCUITRY

CROSS REFERENCE TO RELATED PATENT APPLICATIONS

The present invention is related to the subject matter disclosed in, and claims priority from, U.S. Provisional Patent Application Serial No. 60/238,228 filed Oct. 5, 2000 for: "Test Interface for Interfacing 1 GHz-Range DRAM Macro to 250 MHz Tester", the disclosure of which is herein specifically incorporated by this reference. The present invention is further related to the subject matter disclosed in U.S. patent application Ser. No. 09/652,405 filed Aug. 31, 2000 for: "Synchronous Realignment Technique for Time-Skewed Single Data Rate (SDR) and Double Data Rate (DDR) Integrated Circuit Memory Devices", the disclosure of which is also specifically incorporated by this reference.

BACKGROUND OF THE INVENTION

The present invention relates, in general, to the field of testing the functionality of integrated circuit memory devices. More particularly, the present invention relates to a test interface of particular applicability in verifying the functionality of high speed embedded memories such as synchronous dynamic random access memories ("SDRAM").

At present, the testing of high speed integrated circuit memory devices, particularly embedded memories, requires the use of similarly high speed capable testers. This then precludes the use of existing, relatively slower speed test environments while the higher speed test equipment becomes increasingly expensive to produce and purchase. Moreover, the higher device speed testing capability of even state-of-the-art test equipment is nevertheless still limited by the bandwidth of the physical interface connections and bussing to the device under test.

Since embedded memory macros generally interface only to other on-chip circuitry, the operating speeds of such memory arrays are generally significantly faster than that of commodity dynamic random access memory ("DRAM") components that instead connect to off-chip circuitry and interface busses. Typically, embedded memories operate at frequencies several times faster than non-embedded memories. Further, embedded memory arrays usually have extremely wide input/output ("I/O") configurations (e.g. typically 128 to 256 bits wide) which also adds to the already high degree of difficulty in the high speed testing of these memories.

SUMMARY OF THE INVENTION

The high speed test interface for embedded memories particularly disclosed herein advantageously allows for the utilization of existing, relatively low speed, (and hence low cost), testers to test high speed memory macros or other embedded memory including SDRAM. The present invention specifically provides a on-chip test interface and method for verification of an embedded memory macro design that can use these relatively low-cost memory testers. This is effectuated by means of a test interface for providing access to an embedded memory macro with separate on-chip test circuitry so that half-rate, narrow word, input signals from the tester can perform all memory macro operations across the breadth of the wide I/O architecture. The on-chip test circuitry may include a synchronizing circuit in order to minimize skew between the external clock and the data output from the test chip.

In the particular implementation of the present invention disclosed herein, a monolithically integrated "hard-wired" and constantly enabled interface is provided between an embedded memory macro and the external off-chip tester. The external clock inputs can then operate at half the frequency of the on-chip clock. This is effectuated by using a clock frequency doubler in the test chip interface circuitry (integrated on-chip) that accepts two differential clocks (e.g. CLK0, CLK0B, CLK1 and CLK1B) where the CLK1 signal is delayed from the CLK0 signal clock by 90 degrees. The present invention further incorporates the technique of latching data from input pad-pair sources to one or more 2-to-1 multiplexer(s) that use the internal frequency doubled clock signals to switch the multiplexer(s) for generation of data as an input to the embedded DRAM macro at twice the rate of the externally applied data. This data-in acceleration is also used for input data masking (for data mask bits that operate at the same rate as the data in).

In a particular implementation of the present invention, sixteen data inputs are used by eight data-in accelerators where the output of each data-in accelerator is connected in parallel to the data inputs of four byes of the memory macro. In this way, sixteen external data inputs can be used to write eight groups of four bytes (32 bits) of inputs resulting in all 256 data inputs being written to an externally determined data state. In a "read" operation from the 256 bit wide I/O bus, data multiplexing is carried out such that a multiplexer signal selects one-of-thirty two outputs within a four byte field to be read from one of the output data pins.

The multiplexer may be split into two levels with multiplexing selection being carried out as a one-of eight operation, followed by a one-of-four. Through the use of the technique disclosed herein, a data rate reduction is implemented wherein either "even" data or "odd" data is sent to the data output pins of the test chip. "Even" or "odd" data is selected by means of another multiplexer signal which, in a representative embodiment, determines if the synchronizer captures and aligns "even" or "odd" data. In this manner, the synchronizer performs two tasks, to wit, "even"/"odd" data selection and realignment of the output data to the system clock to "de-skew" the output data.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a diagram showing the relationship of FIGS. 1A and 1B.

FIG. 8 is a simplified, high-level block diagram of one of the two test data-out (Dout) blocks illustrated in FIG. 1 and an associated 8 Meg block of the 16 Meg memory macro;

FIG. 9 is a functional block diagram of a test read data path comprising a pair of test data out multiplexers ("TQMUX1" and "TQMUX2");

DESCRIPTION OF A REPRESENTATIVE EMBODIMENT

Figure 1A:
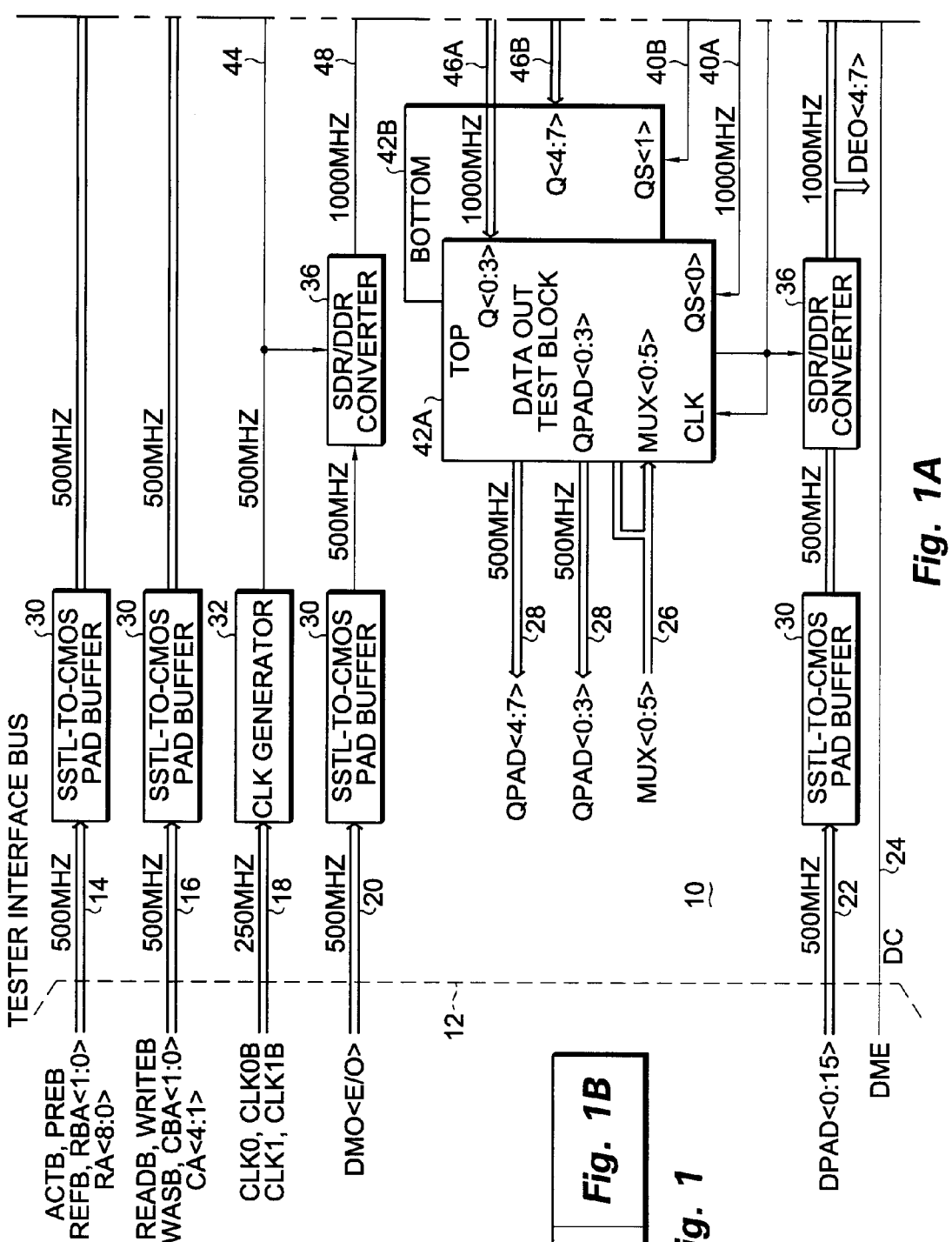
FIGS. 1A and 1B together form a high level functional block diagram of a representative embodiment of the present invention in the form of a 16 Meg memory macro cell test interface circuit.
Figure 1B:
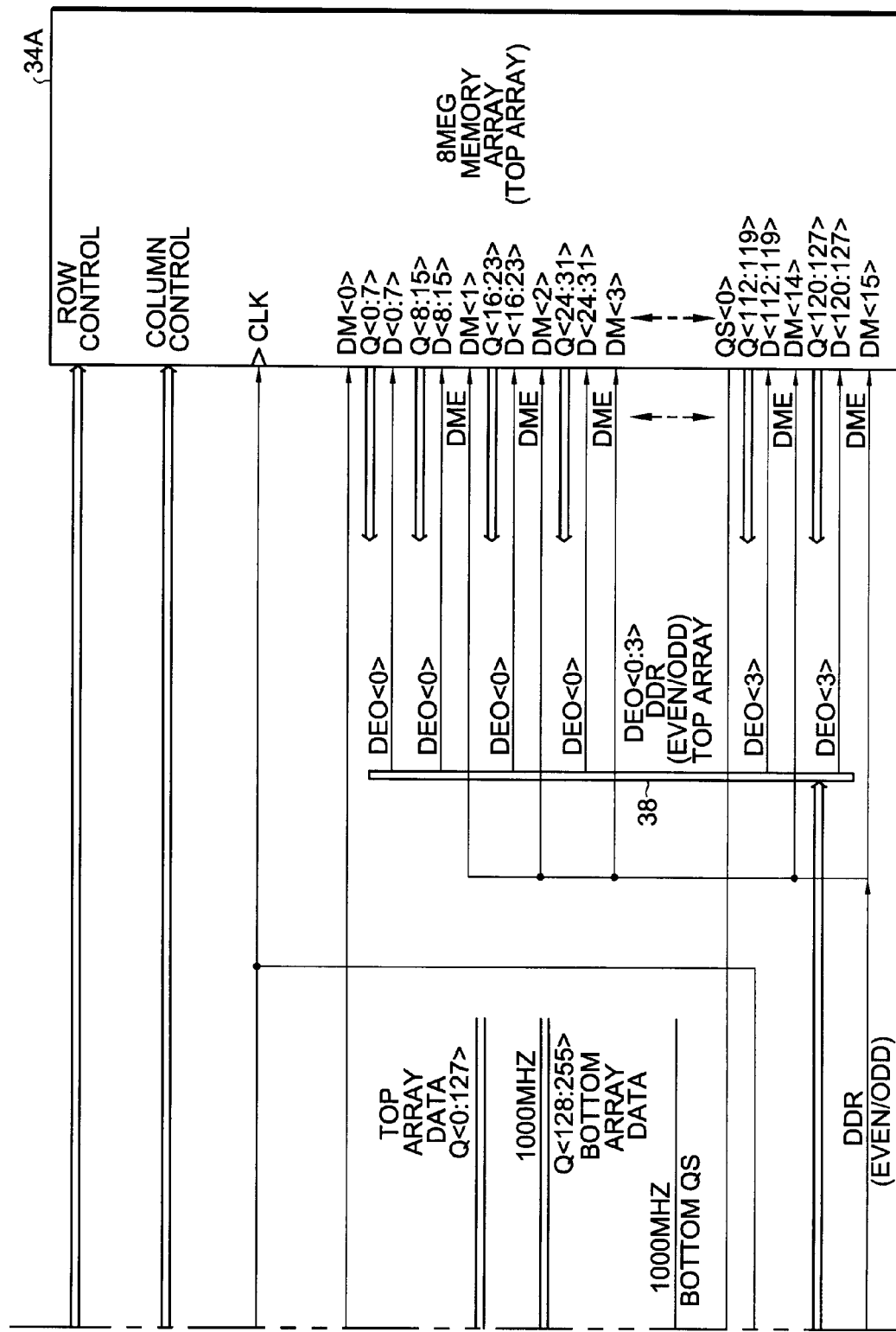

With reference now to FIG. 1, a high level functional block diagram of a representative embodiment of the present invention is illustrated in the form of a 16 Meg memory macro cell test interface circuit 10. In the exemplary embodiment shown, the test interface circuit 10 includes a test interface bus 12 which includes a 500 MHz bus 14 for receiving a number of command control signals including ACTB (activate bar), PREB (precharge bar), REFB (refresh bar), RBA<1:0> and RA<8:0> (row address); a 500 MHz bus 16 for receiving READB (read bar), WRITEB (write bar), WASB (write address strobe bar), CBA<1:0> and CA<4:1> (column address) command control signals; a 250 MHz clock bus 18 for receiving complementary clock 0 (CLK0 and CLK0B) and clock 1 signals (CLK1 and CLK1B) and a 500 MHz data mask bus 20 for receiving a DMO<E/O> (Even/Odd) input signal. The test interface bus 12 further includes a 500 MHz DPAD<0:15> (data pad) bus 22 and a direct current ("DC") DME (data mask enable) line 24. A MUX<0:5> bus 28 provides inputs to the test interface circuit 10 as will be more fully described hereinafter. Outputs from the test interface circuit 10 through the test interface bus 12 include separate 500 MHz QPAD<0:3> and QPAD<4:7> buses 28, each corresponding respectively to a "top" and "bottom" portion of the test interface circuit 10.

The test interface circuit 10 includes a number of stub-series terminated logic-to-complementary metal oxide semiconductor ("SSTL-to-CMOS") pad buffer circuits 30 for coupling the buses 14 and 16 to a pair of 8 Meg memory array macros 34A (the "top" array; the "bottom array 34B is not shown). A clock ("CLK") generator circuit 32 provides a 500 MHz macro clock signal ("MCLK") in response to the 250 MHz input signal on bus 18. The MCLK signal is supplied on line 44 to the macros 34 as well as to a first single data rate-to-double data rate ("SDR/DDR") converter circuit 36 as will be more fully described hereinafter. The 500 MHz DMO<E/O> bus 20 is also supplied to another SSTL-to-CMOS pad buffer 30 to provide a 500 MHz output which is also supplied to the first SDR/DDR converter 36 to supply a 1000 MHz (1 GHz) DM<0> signal on line 24 to the memory macros 34.

The DPAD<0:15> bus 22 is also supplied to another SSTL-to-CMOS pad buffer 30 to provide a 500 MHz signal to a second SDR/DDR converter 36 which also receives the MCLK signal on line 44. This SDR/DDR converter circuit 36 provides 1000 MHz (data even/odd) DEO<0:3> signals on bus 38 (to "top" array 34A) and DEO<4:7> (to the "bottom" array 34B, not shown). The DC data mask even ("DME") signal on line 24 is supplied to the DM<0:15> inputs of the "top"8 Meg macro 34A and a corresponding "DMO" signal (not shown) is supplied to the "bottom" macro 34B (also not shown).

A corresponding pair of data-out test block circuits 42A ("top") and 42B ("bottom") correspond to each of the 8 Meg macros 34A and 34B (not shown). They are respectively coupled to the data output buses 46A and 46B to receive corresponding data output signals Q<0:127> and Q<128:255>. Each also receives a 1000 MHz QS (data output strobe) signal wherein QS<0> corresponds to "even" data and QS<1> corresponds to "odd" data. Each of the data-out test block circuits 42A and 42B is also coupled to receive the MCLK signal at their respective CLK inputs.

In operation, the command control signals on buses 14 and 16 are clocked on the rising edge of the CLK signals. Double data rate operations occur in a fixed sequence with "even" data (CA0=0) followed by "odd" data (CA0=1). Both "even" and "odd" data are accessed during "read" cycles and each (or both) can be selectively written during "write" cycles depending on the state of the DM (data mask) signals. "Even" data-in and "even" DM signals are clocked by the rising edge of the CLK signal. "Odd" data-in and "odd" DM signals are clocked by the falling edge of the CLK signal. The WASB signal on bus 16 loads a "write" column address into a write address first-in, first-out ("FIFO") circuit (not shown) which serves as the address source for all write cycles. The FIFO is disclosed in more detail in United States Pat. Ser. No. 6,622,198 for: "Look-Ahead, Wrap-Around First-In, First-Out Integrated (FIFO) Circuit Device Architecture" filed Mar. 22, 2001, the disclosure of which is herein specifically incorporated by this reference.

In an exemplary embodiment of the present invention, a 250 MHz Advantest T5581H (double clocked) may be utilized in conjunction with the test interface circuit 10 to achieve the 500 MHz tester interface bus 12 frequency and to interface between the external tester and the memory macro 34. The test interface circuit 10 is operational to convert the 250 MHz differential clocks (CLK0/CLK0B and CLK1/CLK1B) on bus 18 to a 500 MHz MCLK signal on line 44. It further serves to convert 256 data outputs at 1 GHz on bus 46 down to 8 outputs on bus 28 at 500 MHz using the MUX<0:5> signals on bus 26 to determine which bits are "read". The test interface circuit 10 further functions to convert 16 data-in inputs at 500 MHz on bus 22 to eight bits at a 1 GHz rate to write 256 bits on bus 38 to the memory macros 34. A number of SSTL-to-CMOS pad buffers 30 are used to provide a high speed interface to the tester and a novel synchronizer circuit is used to capture the 1 GHz output data from the macros 34 on bus 46 to allow the 500

MHz MCLK signal on line 44 to clock out "even" or "odd" data with the synchronizer circuit also serving to realign the data output to the MCLK signal. Overall, the test interface circuit 10 of the present invention functions to increase "read" latency from 2.5 ("even" data) and 3.0 ("odd" data) cycles to 5.0 and 5.5 cycles respectively.

Figure 2:
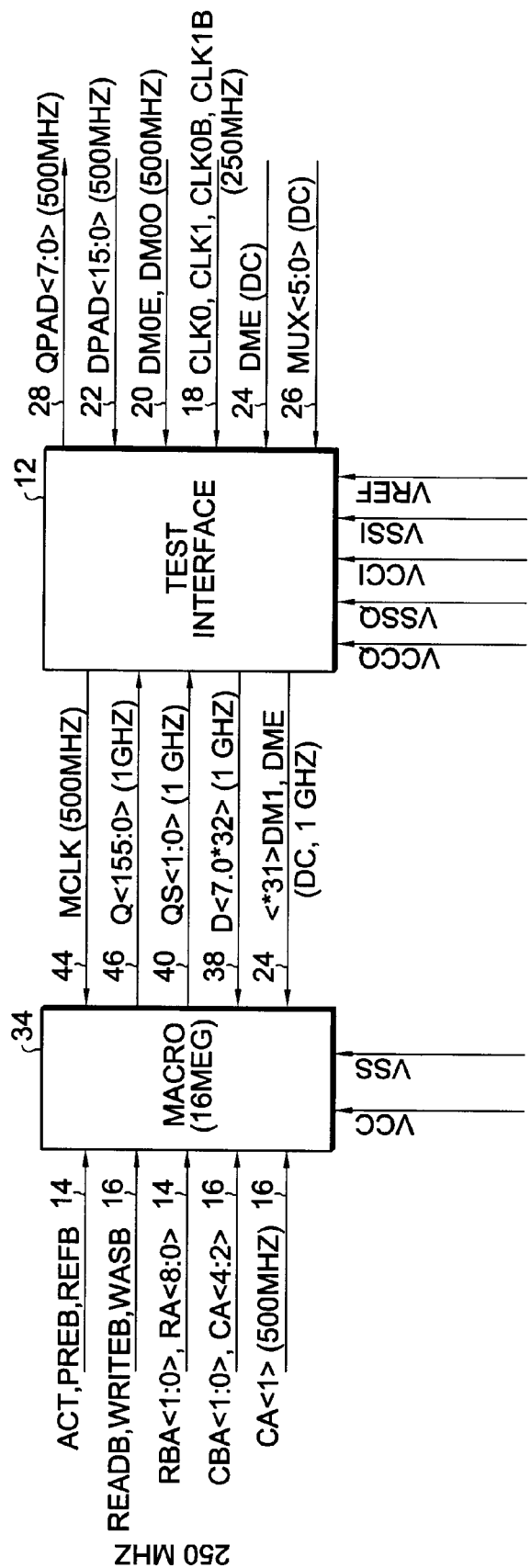
FIG. 2 is another, simplified, higher level view of the structure of the preceding figure comprising a block diagram of the 16 Meg macro and the associated tester interface bus.

With reference now to FIG. 2, another, simplified, higher level view of the structure of the preceding figure is shown comprising a block diagram of the 16 Meg macro 34 (comprising 8 Meg memory macros 34A and 34B) and the associated tester interface bus 12. In this figure, like structure and signals to that previously described with respect to FIG. 1 is like numbered and the foregoing description thereof shall suffice herefor.

Figure 3:
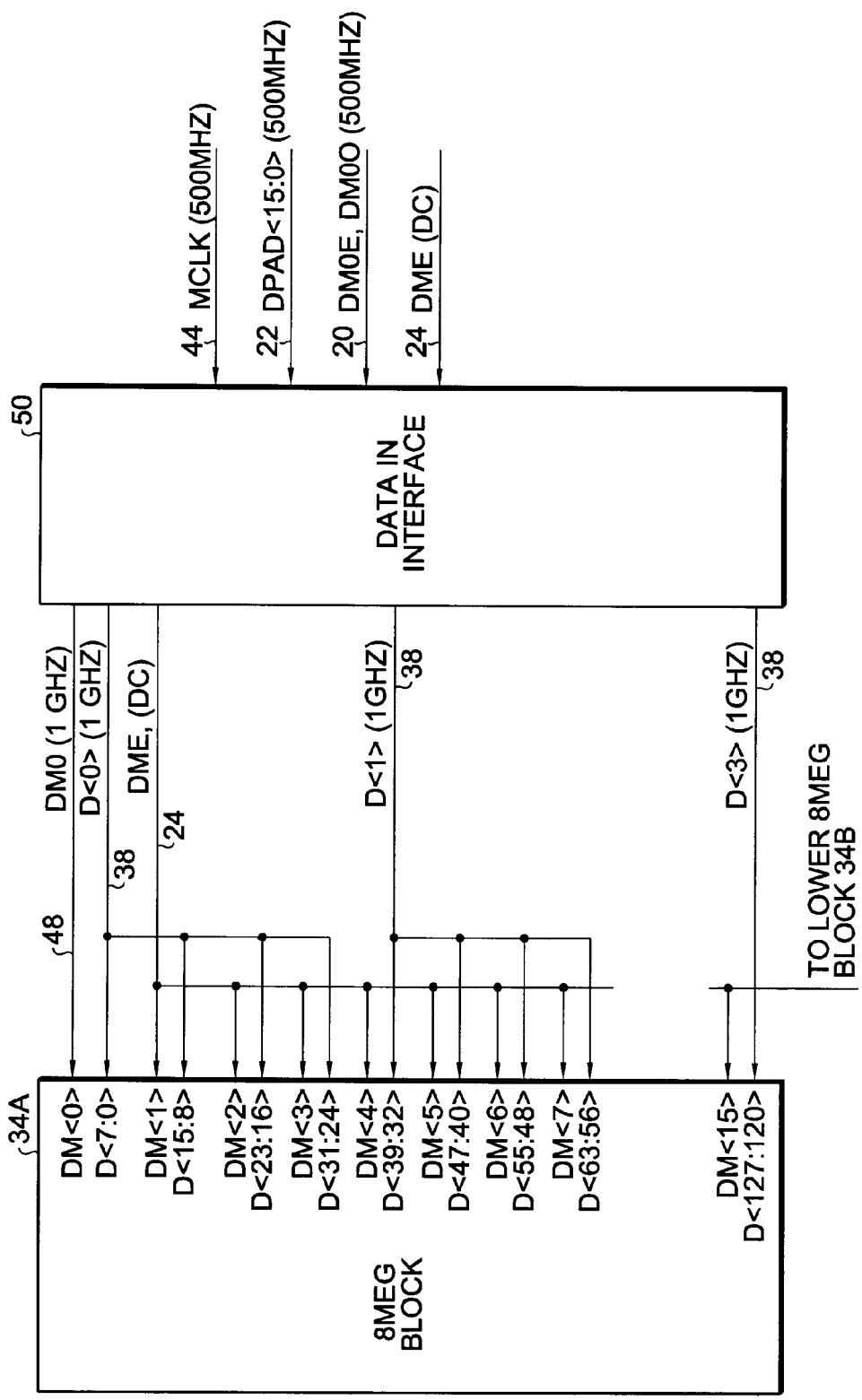
FIG. 3 is a block diagram of a test data-in (Din) circuit comprising an 8 Meg block of the 16 Meg macro and an associated data-in interface circuit.

With reference now to FIG. 3, a block diagram of a test data-in (Din) circuit is shown comprising an 8 Meg block 34A of the 16 Meg macro 34 and an associated data-in interface circuit 50. Again, like structure and signals to that previously described with respect to FIGS. 1 and 2 is like numbered and the foregoing description thereof shall suffice herefor.

Figure 4:
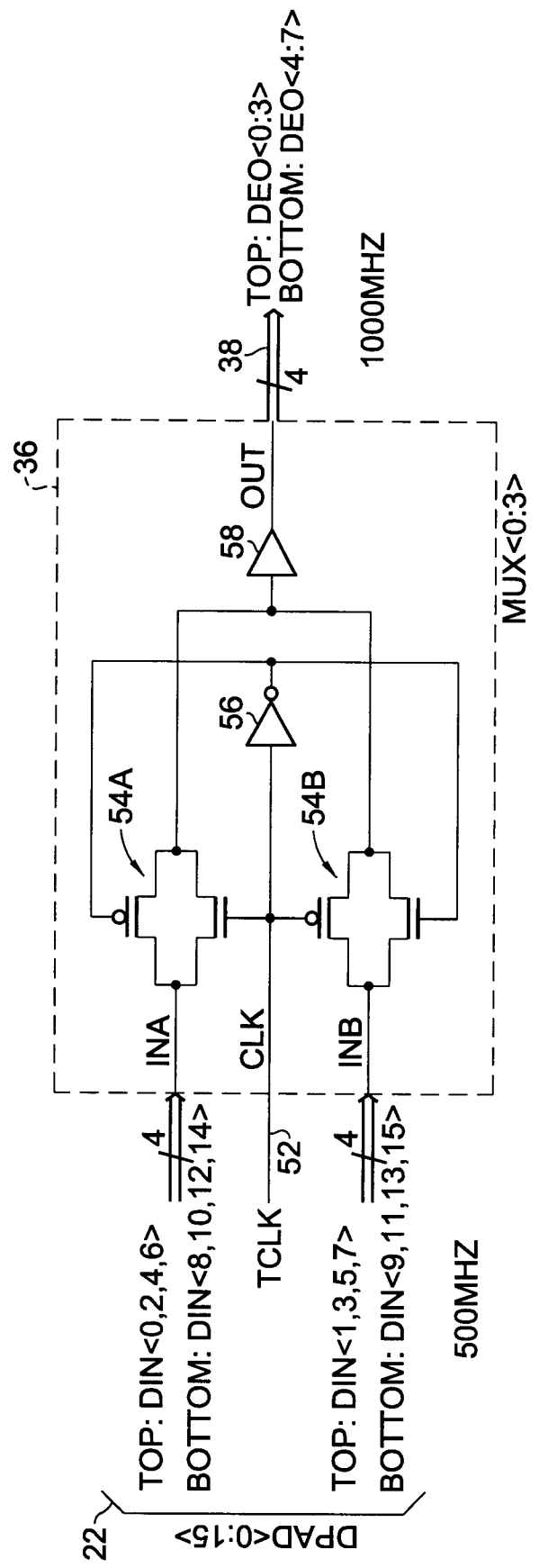
FIG. 4 is a logic block diagram of one of four data-in single data rate ("SDR") to double data rate ("DDR") converters illustrated in the circuit of FIG. 1.

With reference now to FIG. 4, a logic block diagram of one of four data-in single data rate ("SDR") to double data rate ("DDR") converters 36 previously illustrated in the circuit of FIG. 1 is shown, each corresponding to one of the multiplexers MUX<0:3>. Data input to the converters 36 is received from the DPAD<0:15> bus 22 with the "even" data directed to the INA input and the "odd" data directed to the INB input. In particular, the DIN<0,2,4,6> data intended for the "top" memory macro 34A and the DIN<8,10,12,14> intended for the "bottom" memory macro 34B is provided to the INA input. In like manner, the DIN<1,3,5,7> data intended for the "top" memory macro 34A and the DIN<9, 11,13,15> intended for the "bottom memory macro 34B is provided to the INB input. The data is input at a 500 MHz clock rate.

A test clock ("TCLK") signal derived from the MCLK signal (as will be more fully illustrated hereinafter) is supplied on line 52 to one control terminal of a pair of CMOS transmission gates 54A and 54B. The TCLK signal is inverted by means of inverter 56 and then applied to the opposite control terminal of the transmission gates 54A and 54B. The data input signals on inputs INA and INB are, respectively, passed through the transmission gates 54A and 54B respectively as controlled by the TCLK signal on line 52. The outputs of the transmission gates 54A and 54B are combined at the input of another inverter 52 to be supplied on DEO bus 38 with the DEO<0:3> data and the DEO<4:7> data being directed to the "top" and "bottom" memory macros 34A, 34B respectively at a 1000 MHz rate. An SDR-to-DDR converter 36 is also utilized for "even"/"odd" masking to produce the DM<0> and DM<1> signals on line 48 to the "top" and "bottom" memory macros 34A and 34B.

Figures 5, 5A:
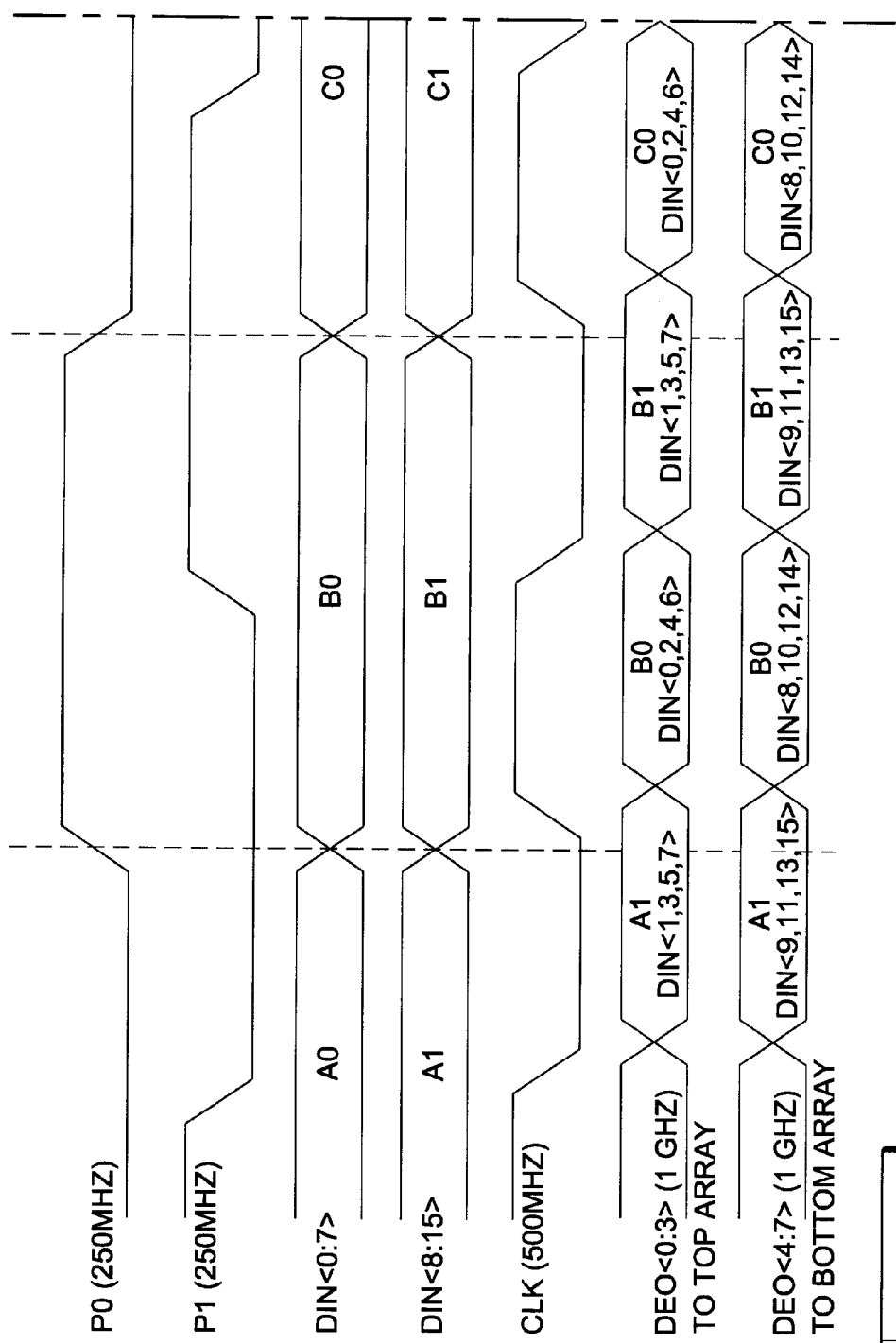
FIG. 5 is a diagram showing the relationship of FIGS. 5A and 5B.
FIGS. 5A and 5B together form a data in SDR-to-DDR conversion timing diagram for the SDR-to-DDR converter of the preceding figure.
Figure 5B:
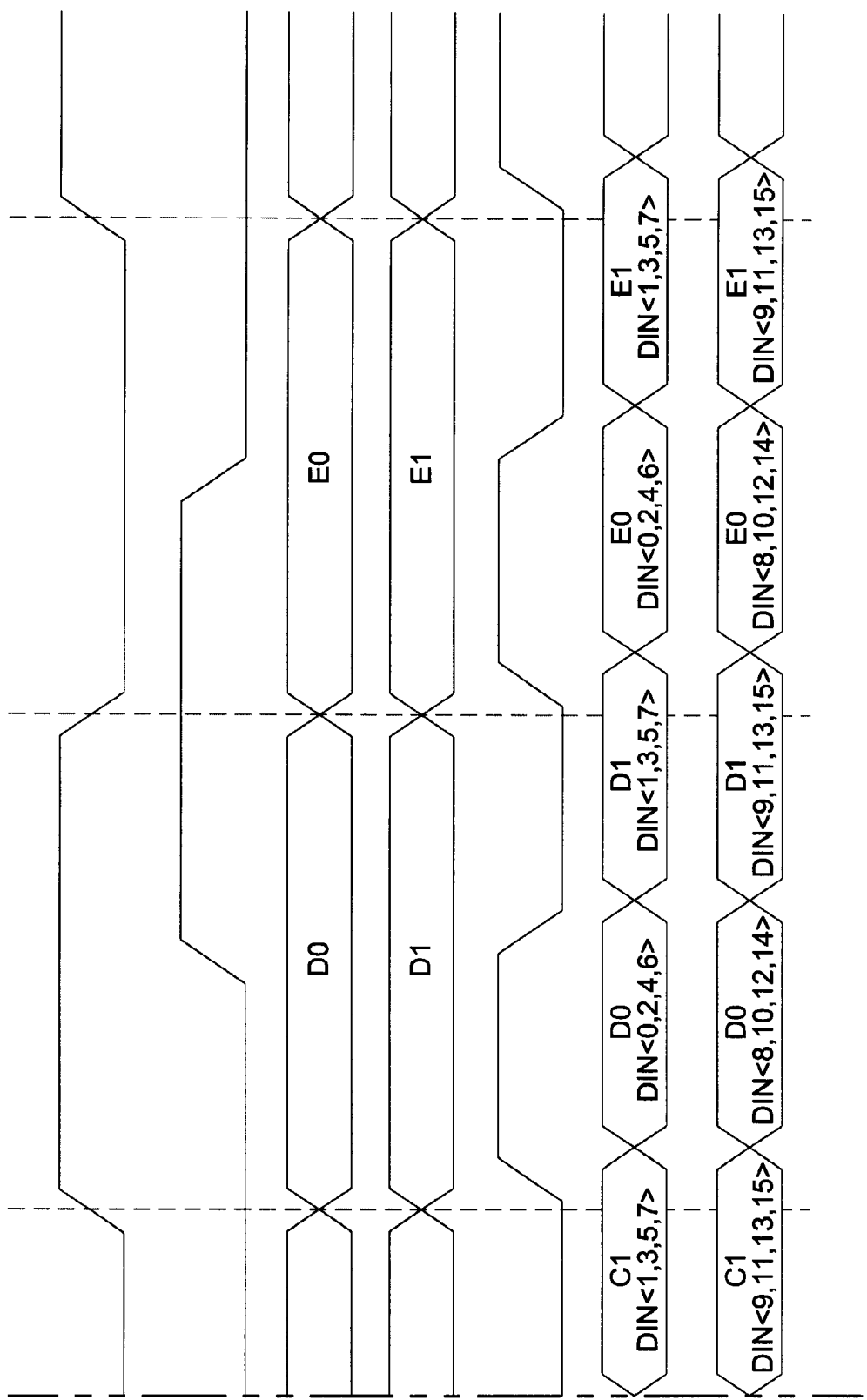

With reference now to FIG. 5, a data-in SDR-to-DDR conversion timing diagram for the SDR-to-DDR converter 36 of the preceding figure is shown. The respective phases of the CLK0 and CLK1 signals on bus 18 (P0 and P1) are shown along with data-in signals DIN<0:7> and DIN<8:15> on DPAD<0:15> bus 22. The 500 MHz TCLK signal on line 52 is then shown as well as the DDR even/odd data on bus 38 comprising DEO<0:3> to the "top" memory array macro 34A (FIG. 1) and DEO<4:7> to the "bottom" macro 34B (not shown).

Figure 6:
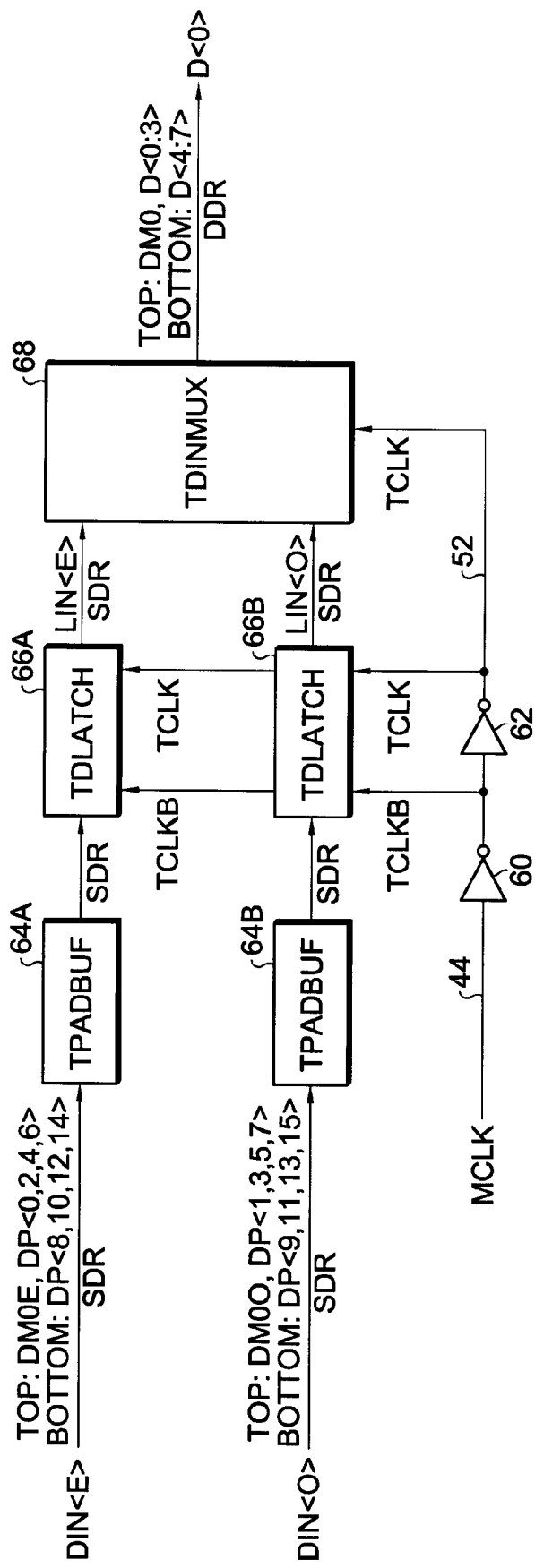
FIG. 6 is a functional block diagram of a test data-in circuit incorporating a pair of test pad buffer ("TPADBUF") and test data latch ("TDLATCH") circuits providing inputs to a test data-in multiplexer ("TDINMUX")

With reference now to FIG. 6, a functional block diagram of a test data-in circuit is illustrated incorporating a pair of test pad buffer ("TPADBUF") 64A and 64B and test data latch ("TDLATCH") 66A and 66B circuits providing inputs to a test data-in multiplexer ("TDINMUX") 68. As shown, the MCLK signal on line 44 is inverted through inverter 60 to produce a TCLKB signal for input to the TDLATCH circuits 66A and 66B and inverted again to produce the TCLK signal which is provided to the TDLATCH circuits 66A, 66B and the TDINMUX 68.

"Even" data in is provided as SDR data to the TPADBUF 64A while corresponding "Odd" data in is provided as SDR data to the TPADBUF 64B. The SDR data buffered in TPADBUF 64A and 64B is respectively latched in TDLATCH 66A and 66B in accordance with the TCLK and TCLKB clock signals. The latched input ("LIN") "even" data LIN<E> and "odd" data LIN<O> is then provided to the TDINMUX 68 where it is multiplexed to the output as DDR data to the "top" and "bottom" memory macros 34A and 34B in accordance with the TCLK clock signal.

Figure 7:
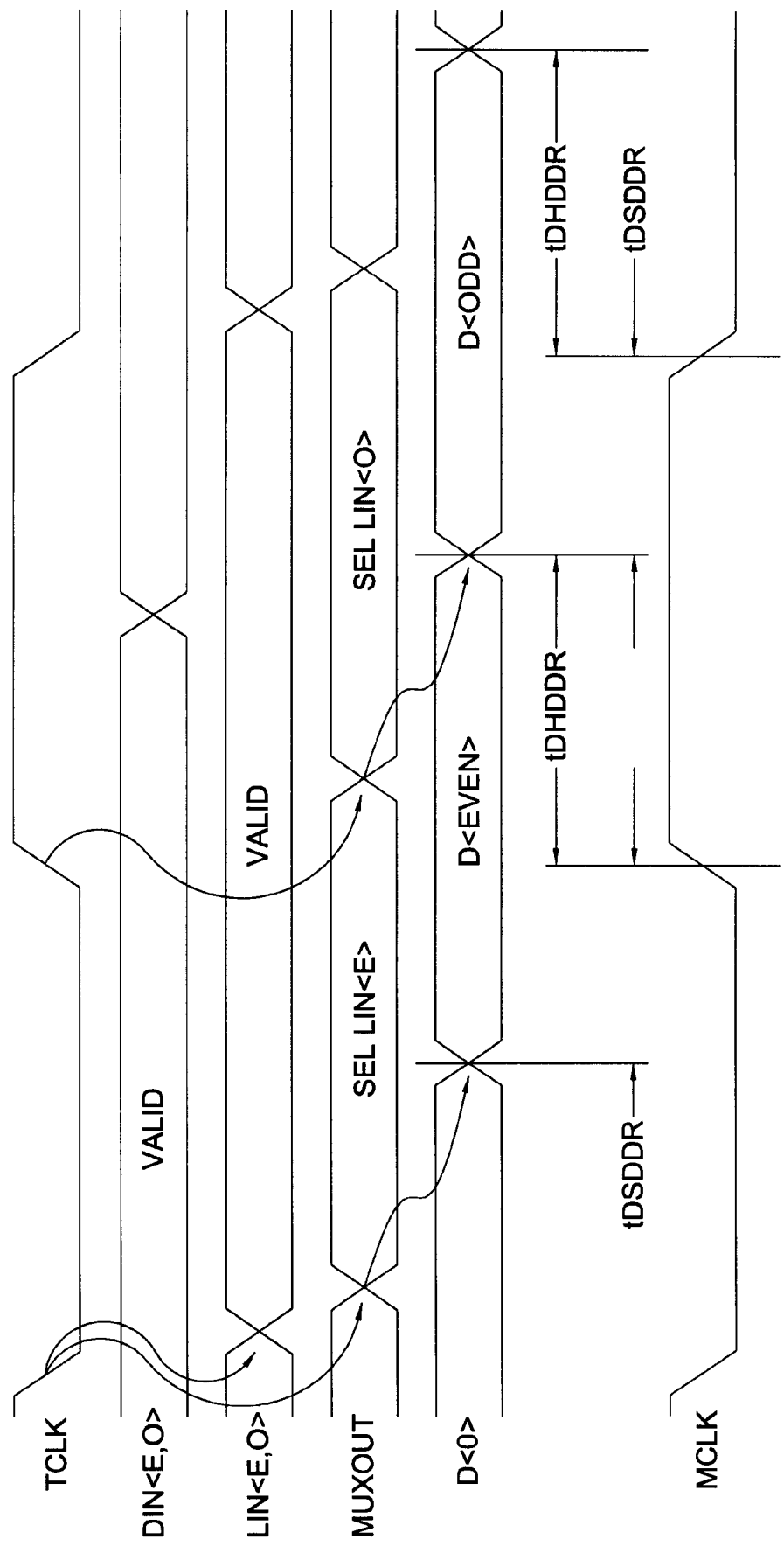
FIG. 7 is a timing diagram for various of the signals depicted in the preceding figure illustrating test data-in timing.

With reference now to FIG. 7, a timing diagram for various of the signals depicted in the preceding figure is shown illustrating test data-in timing. The first trace indicates the TCLK signal on line 52 followed by the "even/odd" SDR data inputs to the TPADBUF circuits 64A and 64B. The outputs of the TDLATCH circuits 66A and 66B is then shown as the signals LIN<E,O> which is provided to the TDINMUX 68. The trace "MUXOUT" shows the internal selection between the SDR latched data inputs received from the TDLATCH circuits 66A and 66B within the TDINMUX 68 and the trace D<O> illustrates its alternating "even/odd" DDR data output. The MCLK signal on line 44 is also illustrated, with the time tDSDDR shown as that from the start of a data output to the next rising or falling edge of MCLK and the time tDHDDR as that from the rising or falling edge of MCLK to the end of the next data output.

With reference now to FIG. 8, a simplified, high-level block diagram of one of the two test data-out (Dout) test blocks 42A, 42B previously illustrated in FIG. 1 is shown including an associated 8 Meg memory block 34A of the 16 Meg memory macro. In this figure, like structure and signals to that previously described with respect to FIG. 1 is like numbered and the foregoing description thereof shall suffice herefor. In this figure, it can be seen that the 1 GHz data output from the memory macro 34A is ultimately output from the data out test block (or interface) 42A as a number of 500 MHz data signals on QPAD<3:0> bus 28.

With reference now to FIG. 9, a functional block diagram of a test read data path is shown comprising a pair of test data out multiplexers ("TQMUX1" and "TQMUX2") forming the data out test blocks 42 previously illustrated. In the representative embodiment shown, the TQMUX1 comprises a number of 8:1 multiplexers 100 coupled to the data output of the memory macro 34 at Q<0:255> bus 46. The TQMUX1 also receives the 1 GHz QS<0:1> signals from bus 40 as well as the MUX<0:5> signals on bus 26, READB signal on bus 16 and TCLK signal on line 52. The TQMUX1 includes a corresponding number of synchronizing registers ("SREG"), which in the embodiment shown is, thirty two, coupled to each of the 8:1 multiplexers 100. Output of the SREGs 102 is then applied to a group of eight additional multiplexers ("TMUX41") 104 coupled to a corresponding number of registers ("TQBREG") 106. Output of the registers 106 is then output through a like number of SSTL output buffers 108 for providing the QPAD<0:7> data output on bus 28.

Figure 10:
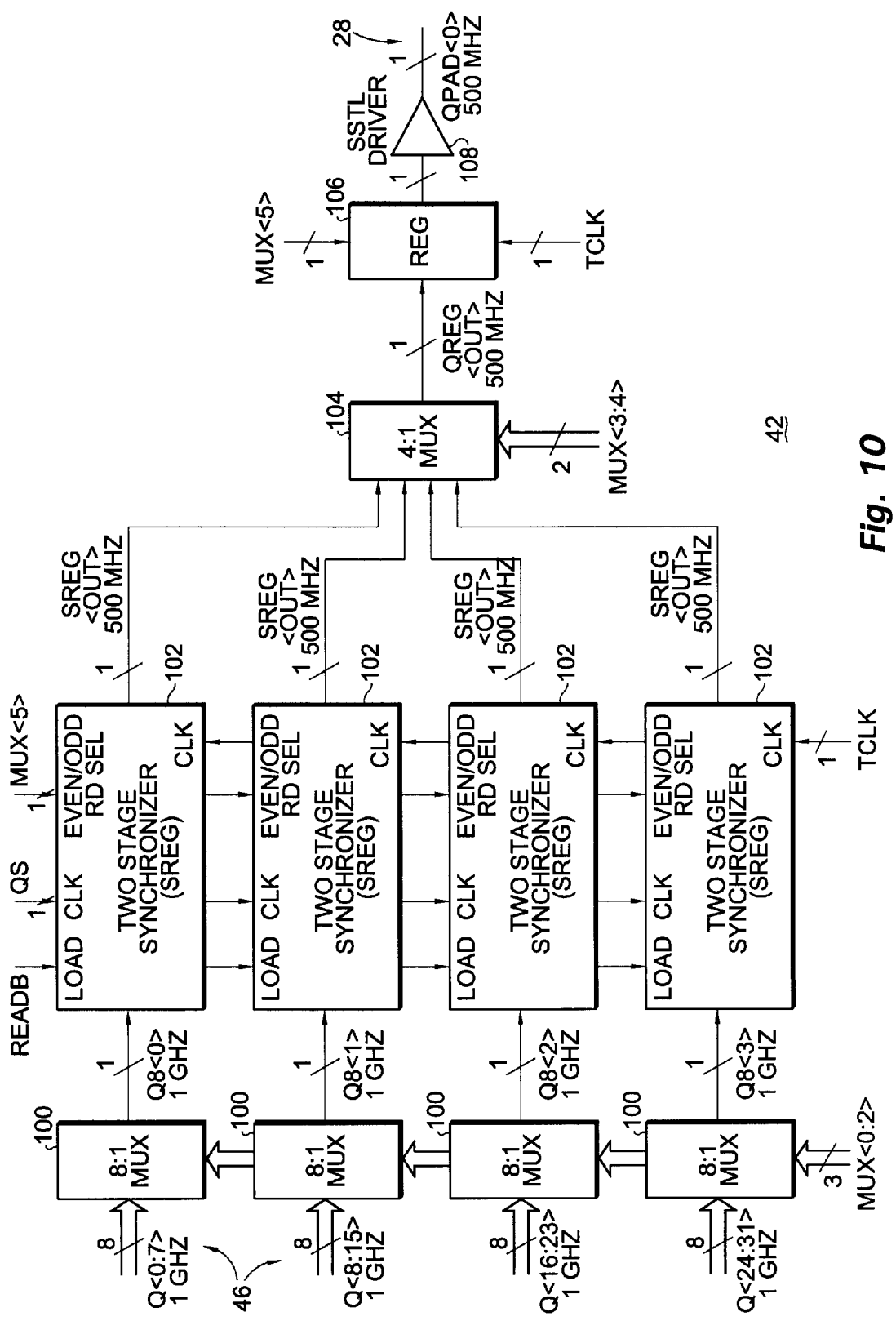
FIG. 10 is an alternative functional block diagram of the data-out test circuit of the preceding figure illustrative of how the 1 GHz data output from the memory macro is converted to a 500 Mhz rate in a representative embodiment of the present invention.

With reference now to FIG. 10, an alternative functional block diagram of the data out test block of the preceding figure is shown illustrative of how the 1 GHz data output from the memory macro 34 is converted to a 500 Mhz rate in a representative embodiment of the present invention. In this figure, like structure and signals to that previously described with respect to FIG. 9 is like numbered and the foregoing description thereof shall suffice herefor. As illustrated, the 1 GHz rate Q<0:31> data output from the memory macro 34 is ultimately provided at the QPAD<0> bus 28 at a 500 MHz rate. In an exemplary embodiment of the present invention, the circuit illustrated is repeated eight times and only the circuit associated with the lower order bytes is shown in this figure. The MUX<0:5> signals are DC control signals with MUX<5>=0 selecting "even" data while MUX<5>=1 selecting "odd" data.

Figure 11:
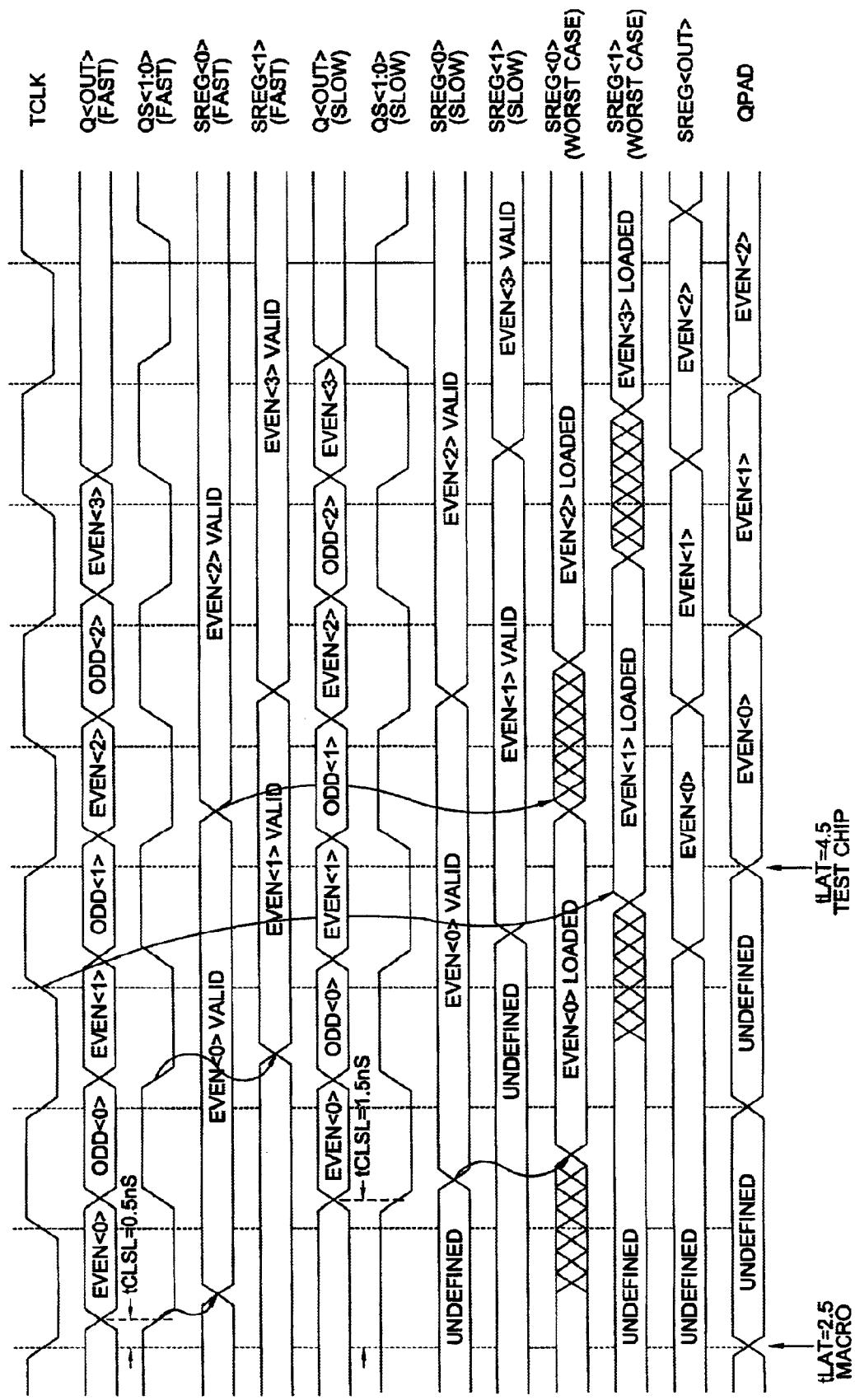
FIG. 11 is a detailed timing diagram of certain of the signals present in an embodiment of FIG. 10 illustrative of the synchronization of "even" data (first data occurring in a DDR sequence.

With reference additionally now to FIG. 11, a detailed timing diagram of certain of the signals present in the embodiment of FIG. 10 are shown illustrative of the synchronization of "even" data in accordance with the technique of the present invention.

The test clock signal ("TCLK") illustrated in the first trace is at a 1 GHz rate and the DDR data illustrated in the second and sixth trace ("Q<OUT>(FAST)" and "Q<OUT>SLOW" respectively) is clocked on both the "rising" and "falling" edges of the TCLK signal, i.e. double data rate. In this illustrative example, the "even" data (trace 2) is clocked at a time $t_{CLSL}$, or the time the QS<1:0> clock signal is slow with respect to the negative going transition of the CLK signal. This is then followed by the "odd" data (illustrated separately in the following FIG. 12) corresponding to the same address following the positive going transition of the CLK signal and so forth for the next addresses. Although shown as sequential in this example, that is data for address "2" follows address "1" which follows address "0", the data may correspond to "even" and "odd" data for addresses in no particular sequence.

As shown, in the "fast" case wherein $t_{CLSL}$=0.5 ns, the "even" data (i.e. EVEN<Q>, EVEN<1> etc.) is valid for the following two clock cycles and the corresponding "even" data, now known to be valid, would be available to be loaded to the appropriate synchronization registers during that time period. This is indicated by traces 3, 4 and 5. Similarly, in the "slow" case wherein $t_{CLSL}$ =1.5 ns, the same "even" data (i.e. EVEN<0>, EVEN<1> etc.) is valid for the following two clock cycles and the corresponding "even" data, again now known to be valid, would be available to be loaded to the appropriate synchronization register during that time period. This is indicated by traces 6, 7, 8 and 9. As shown by the traces 10 and 11, in the worst case condition, the corresponding "even" data is ultimately loaded to the appropriate one of the synchronization registers during a valid time period, whether "fast" or "slow". This data is then subsequently output from the synchronization registers as shown in the penultimate trace and from the circuit as shown in the last trace, together with the "odd" data (not shown).

Figure 12:
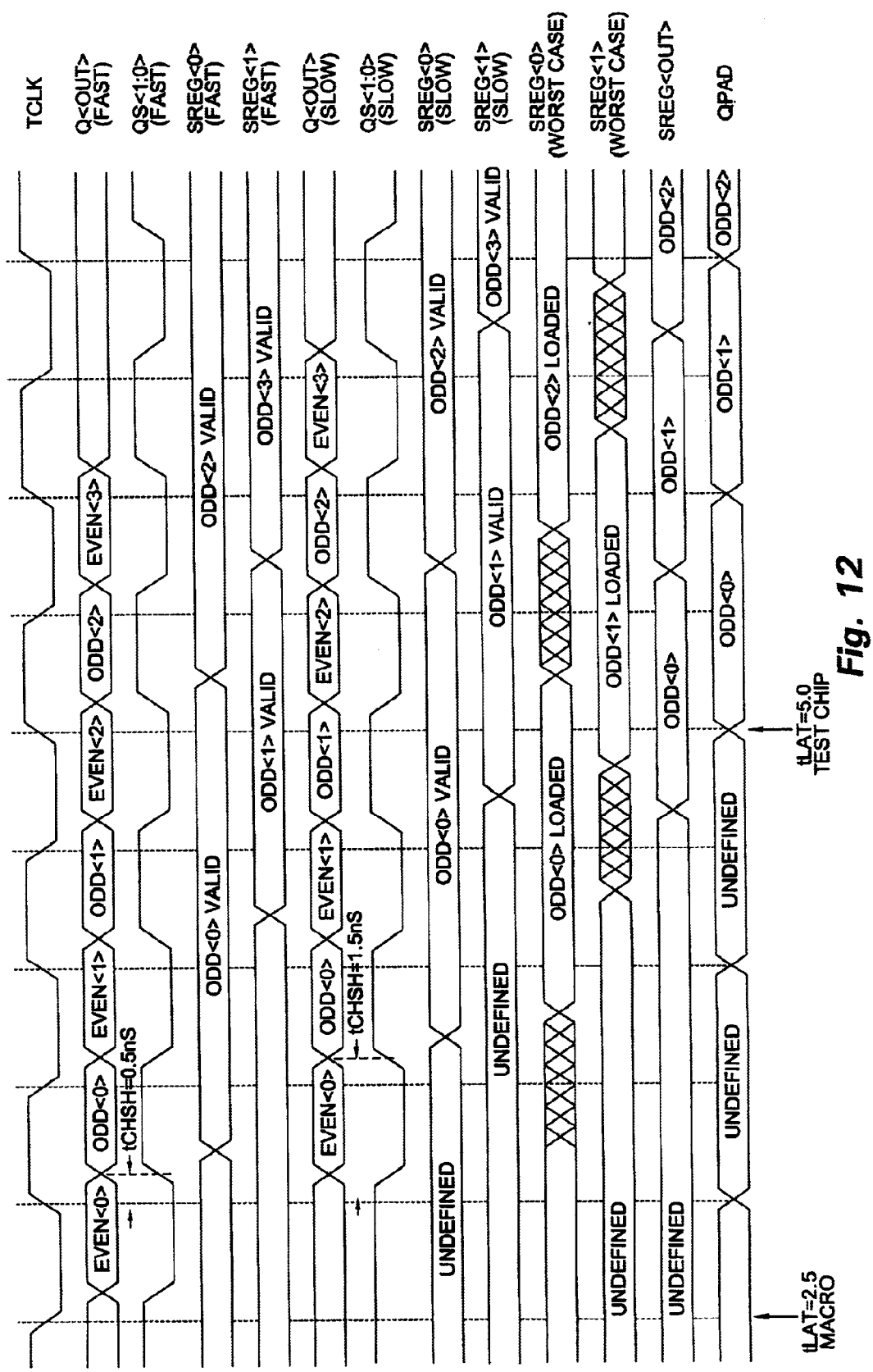
FIG. 12 is another detailed timing diagram of certain of the signals present in the embodiment of FIG. 10 illustrative of the contemporaneous synchronization of "odd" data (second data occurring in a DDR sequence in accordance with the technique of the present invention.

With reference additionally now to FIG. 12, an accompanying detailed timing diagram of certain of the signals present in the embodiment of FIG. 10 is shown illustrative of the contemporaneous synchronization of "odd" (second data occurring in a DDR sequence) data in accordance with the technique of the present invention.

As with respect to the preceding figure, in the "fast" case wherein $t_{CLSL}$=0.5 ns, the "odd" data (i.e. ODD<0>, ODD<1> etc.) is valid for the following two clock cycles and the corresponding "odd" data, now known to be valid, would be available to be loaded to the appropriate synchronization registers during that time period. This is indicated by traces 3, 4 and 5. Similarly, in the "slow" case wherein $t_{CLSL}$ =1.5 ns, the same "odd" data (i.e. ODD<0>, ODD<1> etc.) is valid for the following two clock cycles and the corresponding "odd" data, again now known to be valid, would be available to be loaded to the appropriate synchronization register during that time period. This is indicated by traces 6, 7, 8 and 9. As shown by the traces 10 and 11, in the worst case condition, the corresponding "odd" data is ultimately loaded to the appropriate one of the synchronization registers during a valid time period, whether "fast" or "slow". This data is then subsequently output from the synchronization registers as shown in the penultimate trace and from the circuit as shown in the last trace together with the "even" data illustrated in the preceding figure.

While there have been described above the principles of the present invention in conjunction with specific circuit implementations, clock speeds and data rates, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for constantly enabled testing of a monolithically integrated circuit device comprising:
   inputting data to said device at a first frequency;
   operating on said data at a second substantially higher frequency on said device; and
   outputting said data from said device at said first frequency,
   wherein said first frequency data has a word width lesser than a word width of said second frequency data.

2. The method of claim 1 wherein said second substantially higher frequency is approximately two times said first frequency.

3. The method of claim 1 wherein said second substantially higher frequency is derived by the steps of:
   supplying an external clock signal at said first frequency to said device; and
   doubling said external clock signal on said device to provide an internal clock signal at said second substantially higher frequency.

4. The method of claim 3 wherein said step of outputting said data from said device further comprises the step of:
   realigning said data with said external clock signal.

5. The method of claim 1 wherein said step of operating on said data comprises the step of:
   writing said data to an embedded memory array forming a portion of said device; and
   reading said data from said embedded memory array.

6. A method for constantly enabled testing of a monolithically integrated circuit device comprising:

inputting data words of a first width to said device;

transforming said data words to corresponding data having a second greater width thereof;

operating on said corresponding data to perform said testing; and outputting said data words with a third width lesser than said second width from said device.

7. The method of claim 6 wherein said data words of said first width are 16 bits wide and said corresponding data of said second width are 256 bits wide.

8. The method of claim 6 wherein said data words of said third width are 8 bits wide.

9. The method of claim 7 wherein said step of inputting data words is carried out at a first frequency thereof and said step of operating on said corresponding data is carried out at a second substantially higher frequency thereof.

10. The method of claim 9 wherein said second frequency is substantially two times said first frequency.

11. The method of claim 10 wherein said first frequency is substantially 500 MHz and said second frequency is substantially 1000 MHz.

12. The method of claim 6 wherein said step of outputting said data words comprises the step of:

realigning said output data words with a clock signal supplied to said device.

13. An integrated circuit device having a constantly enabled on-chip test interface to a memory array comprising:

a data input to said device for receiving external data signals at a first frequency thereof;

a data mask input to said device for receiving an external data mask signal at said first frequency;

first and second first data rate-to-second data rate converters for coupling said data mask signal and said data signals to said memory array at a second frequency thereof substantially higher than said first frequency;

at least one data-out circuit coupled to an output of said memory array for coupling data read out of said memory array at said second frequency thereof to said test interface at said first frequency thereof.

14. The device or claim 13 further comprising:

a clock input to said device for receiving an external clock signal at a third frequency thereof substantially lower than said first frequency;

a clock generator coupled to receive said external clock signal to produce an internal clock signal at said first frequency thereof.

15. The device of claim 14 wherein said first frequency of said internal clock signal is substantially two times said third frequency of said external clock signal.

16. The device of claim 14 wherein said third frequency is substantially 250 MHz.

17. The device of claim 13 wherein said second frequency is substantially two times said first frequency.

18. The device of claim 13 wherein said first frequency is substantially 500 MHz and said second frequency is substantially 1000 MHz.

19. The device of claim 13 wherein said data input to said device has a first word width thereof and said data read out of said memory army has a second greater word width thereof.

20. The device of claim 19 wherein said first word width is 16 bits wide and said second word with is 256 bits wide.

21. The device of claim 19 lesser than said second word width wherein data coupled to said test interface by said data-out circuit has a third word width.

22. The device of claim 21 wherein said third word width is 8 bits wide.

23. The device of claim 13 further comprising:

a data realignment circuit coupled to said data-out circuit for realigning said data coupled to said test interface by said data-out circuit to a clock signal supplied to said device.

* * * * *

UNITED STATES PATENT AND TRADEMARK OFFICE
CERTIFICATE OF CORRECTION

PATENT NO. : 6,732,305 B2
DATED : May 4, 2004
INVENTOR(S) : Oscar Frederick Jones, Jr. and Michael C. Parris It is certified that error appears in the above-identified patent and that said Letters Patent is hereby corrected as shown below:

Column 9,
Line 15, "7" should be -- 6 --

Column 10,
Line 24, "army should be -- array --
Line 31, "21" should be -- 20 --

Signed and Sealed this

Thirty-first Day of August, 2004

JON W. DUDAS
*Director of the United States Patent and Trademark Office*